US009910466B1

(12) United States Patent
Strickland et al.

(10) Patent No.: US 9,910,466 B1
(45) Date of Patent: Mar. 6, 2018

(54) MEMORY MODULE MOUNTING SYSTEM

(71) Applicant: EMC CORPORATION, Hopkinton, MA (US)

(72) Inventors: Stephen E. Strickland, Foxboro, MA (US); Jason J. Leone, North Providence, RI (US); Maida Boudreau, Brimfield, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/082,670

(22) Filed: Mar. 28, 2016

(51) Int. Cl.
*G06F 1/18* (2006.01)
*H05K 7/14* (2006.01)
*H05K 7/12* (2006.01)

(52) U.S. Cl.
CPC .............. *G06F 1/185* (2013.01); *H05K 7/12* (2013.01); *H05K 7/1417* (2013.01); *H05K 7/1418* (2013.01); *H05K 7/142* (2013.01)

(58) Field of Classification Search
CPC ...... G06F 1/185; H05K 7/1418; H05K 7/142; H05K 2201/10598; H05K 7/12; H05K 7/1417; H05K 7/14; F16B 5/065
See application file for complete search history.

(56) References Cited

U.S. PATENT DOCUMENTS

| | | | | |
|---|---|---|---|---|
| 3,996,500 A * | 12/1976 | Coules | ...................... | H05K 7/12 174/138 D |
| 4,969,065 A * | 11/1990 | Petri | ...................... | F16B 5/0233 174/138 D |
| 5,281,149 A * | 1/1994 | Petri | ...................... | H05K 7/142 174/138 D |
| 5,964,625 A * | 10/1999 | Farley | .................. | H01R 4/4872 439/817 |
| 6,344,972 B2 * | 2/2002 | Estieule | .................... | H01R 4/64 361/753 |
| 6,493,233 B1 * | 12/2002 | De Lorenzo | ........... | H05K 3/325 174/138 G |
| 8,228,299 B1 * | 7/2012 | Maloney | ................ | G06Q 20/14 345/173 |
| 2008/0018351 A1 * | 1/2008 | Gilliland | ............ | G01R 31/2808 324/756.05 |
| 2010/0165592 A1 * | 7/2010 | Takao | ...................... | G06F 1/185 361/807 |
| 2010/0328835 A1 * | 12/2010 | Shin | ...................... | H05K 9/0067 361/220 |
| 2012/0103031 A1 * | 5/2012 | Grant | .................... | E05B 67/063 70/14 |
| 2013/0072038 A1 * | 3/2013 | Chen | ...................... | H05K 7/142 439/65 |

(Continued)

*Primary Examiner* — Dimary Lopez Cruz
*Assistant Examiner* — Abhishek Rathod
(74) *Attorney, Agent, or Firm* — Brian J. Colandreo; Mark H. Whittenberger; Holland & Knight LLP

(57) ABSTRACT

A memory module mounting system includes a bracket assembly configured to engage a system board. The bracket assembly includes: a standoff assembly that is configured to position a memory module a desired distance from the system board, and an alignment pin assembly configured to position the bracket assembly on the system board. A tether assembly is flexibly coupled to the bracket assembly. A screw assembly is held captive by the tether assembly and configured to pass though the bracket assembly and releasably engage the system board.

17 Claims, 4 Drawing Sheets

(56) References Cited

U.S. PATENT DOCUMENTS

2016/0149323 A1* 5/2016 Figuerado ............ H01R 12/716
  439/345
2016/0294087 A1* 10/2016 Norton ............... H01R 12/7005

* cited by examiner

MEMORY MODULE MOUNTING SYSTEM

TECHNICAL FIELD

This disclosure relates to IT components and, more particularly, to systems for mounting storage devices within IT components.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components are mounted within IT racks and need to be serviced in the field. Naturally, the quicker these components can be serviced, the less downtime for the components.

SUMMARY OF DISCLOSURE

In one implementation, a memory module mounting system includes a bracket assembly configured to engage a system board. The bracket assembly includes: a standoff assembly that is configured to position a memory module a desired distance from the system board, and an alignment pin assembly configured to position the bracket assembly on the system board. A tether assembly is flexibly coupled to the bracket assembly. A screw assembly is held captive by the tether assembly and configured to pass though the bracket assembly and releasably engage the system board.

One or more of the following features may be included. The screw assembly may be an electrically conductive screw assembly. The screw assembly may be configured to engage a ground plane of the memory module. The screw assembly may be configured to engage a ground plane of the system board. The screw assembly may be a toolless screw assembly. The screw assembly may be configured to releasably engage a nut assembly coupled to the system board. The tether assembly may be constructed of a flexible, non-conductive material. The bracket assembly may be constructed of a non-conductive material. The alignment pin assembly may be configured to releasably engage an alignment hole within the system board. The memory module may be a non-volatile memory module. The memory module may be an M.2 memory module.

In another implementation, a memory module mounting system includes a bracket assembly configured to engage a system board. The bracket assembly includes: a standoff assembly that is configured to position a memory module a desired distance from the system board, and an alignment pin assembly configured to position the bracket assembly on the system board. A tether assembly is flexibly coupled to the bracket assembly, wherein the tether assembly is constructed of a flexible, non-conductive material. An electrically conductive screw assembly is held captive by the tether assembly and configured to pass though the bracket assembly and releasably engage the system board.

One or more of the following features may be included. The screw assembly may be configured to engage a ground plane of the memory module. The screw assembly may be configured to engage a ground plane of the system board. The screw assembly may be configured to releasably engage a nut assembly coupled to the system board. The alignment pin assembly may be configured to releasably engage an alignment hole within the system board. The bracket assembly may be constructed of a non-conductive material.

In another implementation, a memory module mounting system includes a bracket assembly configured to engage a system board. The bracket assembly includes a standoff assembly that is configured to position an M.2 memory module a desired distance from the system board. An alignment pin assembly is configured to position the bracket assembly on the system board. A tether assembly is flexibly coupled to the bracket assembly. An electrically conductive screw assembly is held captive by the tether assembly and configured to pass though the bracket assembly and releasably engage the system board. The screw assembly is configured to engage a ground plane of the M.2 memory module and a ground plane of the system board.

One or more of the following features may be included. The screw assembly may be a toolless screw assembly. The alignment pin assembly may be configured to releasably engage an alignment hole within the system board.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
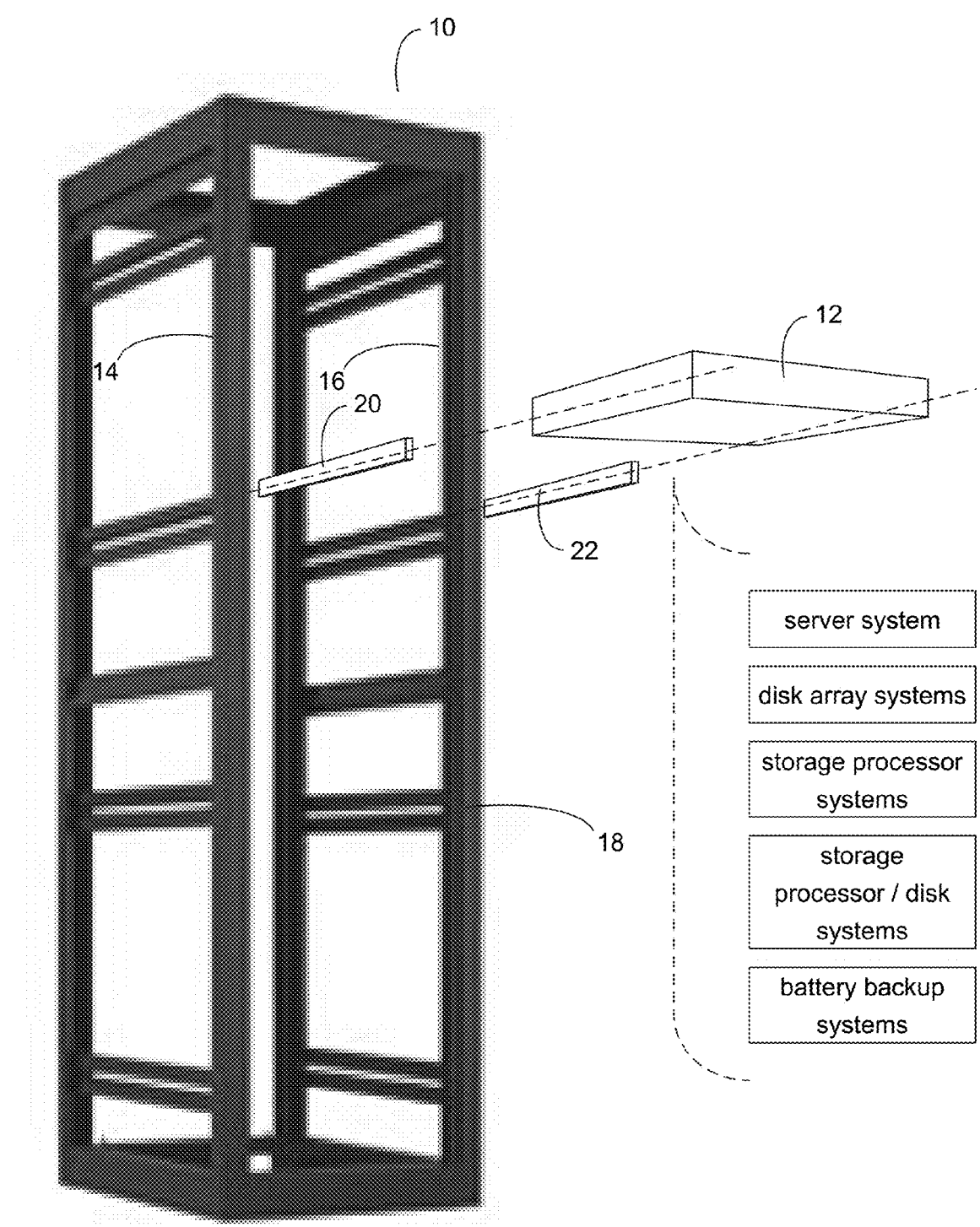
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT devices that fit within a first IT rack may also fit within a second IT rack.

These various IT components (e.g., IT component 12) may be available in standardized heights based upon the number of rack units (U's). Examples of such standardized heights may include but are not limited to 1 U IT components, 2 U IT components, 3 U IT components, and 4 U IT components, wherein a 1 U IT component is half as high as a 2 U IT component, which is half as high as a 4 U IT component.

IT racks (e.g., IT rack 10) may be available in various heights, which are capable of accommodating a defined number of rack units (U's). However, while the number of rack units available within a particular IT rack may be rigidly defined by the height of the IT rack, the number of IT components mountable within that IT rack may vary depending upon the height in rack units (U's) of the particular IT components being mounted within that IT rack. Therefore, by reducing the number of rack units utilized by a particular IT component within an IT rack, additional IT components may be mounted within the IT rack.

Figure 2A:
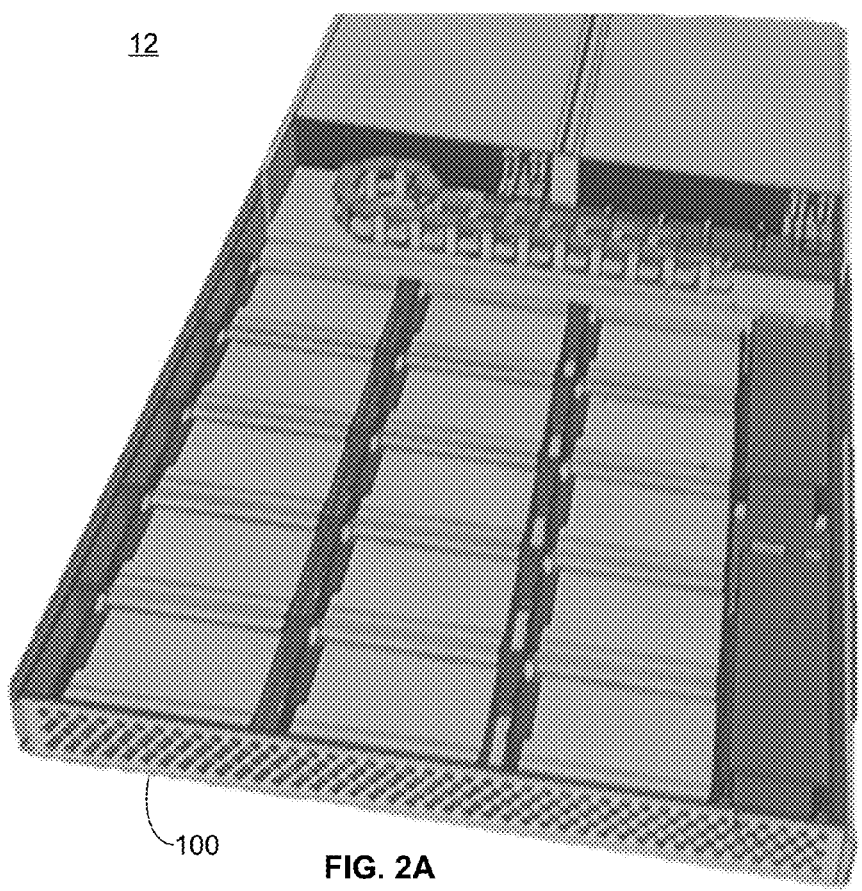
FIG. 2A is a perspective view of the IT component of FIG. 1.
Figure 2B:
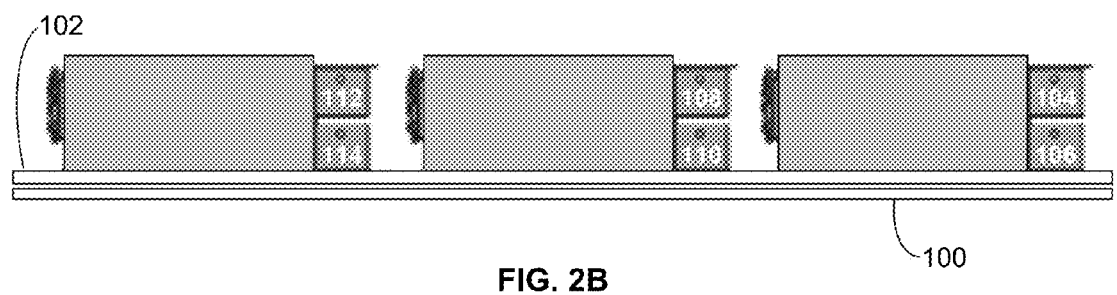
FIG. 2B is a front view of the IT component of FIG. 1.
Figure 3:
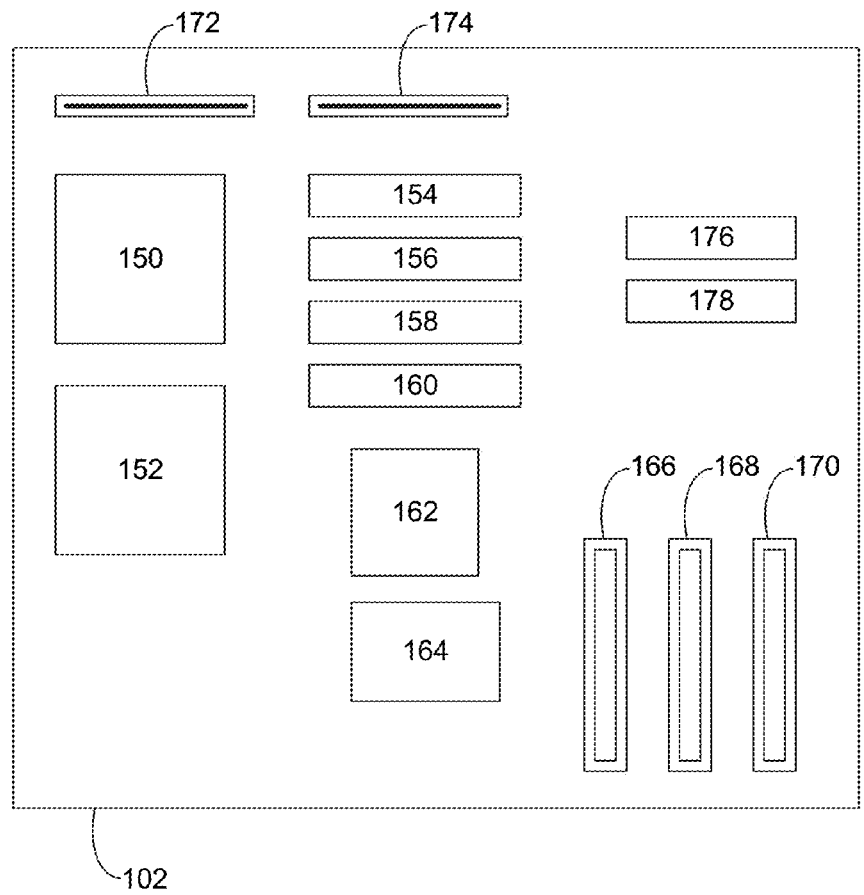
FIG. 3 is a diagrammatic view of a system board of the IT component of FIG. 1.

Referring also to FIGS. 2A & 2B, there is shown the internal components of one implementation of IT component 12, wherein IT component 12 is shown to include chassis assembly 100, system board 102, and one or more storage devices 104, 106, 108, 110, 112, 114. Referring also to FIG. 3, there is shown one implementation of system board 102. In this example, system board 102 is shown to include various components such as one or more processors (e.g., processor 150, 152), volatile memory (e.g., RAM modules 154, 156, 158, 160), memory controller 162, I/O controller 164, expansion slots 166, 168, 170, and data connectors 172, 174. Additionally, system board 102 may include one or more memory modules (e.g., memory modules 176, 178). Examples of memory modules 176, 178 may include non-volatile memory modules that may e.g., store the content of cache memory in the event of a failure of IT component 12, function as cache memory itself, or store licensing information for installed software. Memory modules 176, 178 may be interfaced with system board 102 using various interfaces, such as PCIe, eSATA, SAS, or USB. Additionally, memory modules 176, 178 may be configured in various form factors, such as an M.2 memory module. As is known in the art, M.2 is a specification for internally mounted computer expansion cards and associated connectors.

As is also known in the art, M.2 modules are available in different lengths, such as 40 mm, 60 mm, 80 mm and 110 mm, wherein the length of the M.2 memory module may vary depending upon the quantity of memory included within the memory module. System board 102 may be configured to accommodate these varying length modules.

Figure 4:
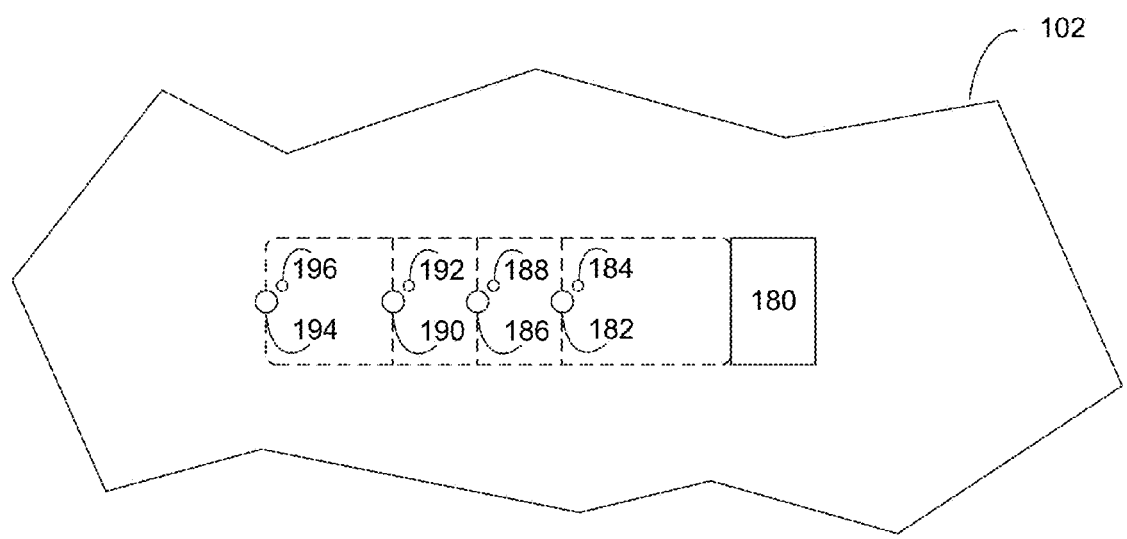
FIG. 4 is a detail view of a portion of the system board of FIG. 3.

Referring also to FIG. 4, system board 102 may include connector 180 that is used for all modules (regardless of length). Additionally, system board 102 may include separate mounting points for 40 mm modules, 60 mm modules, 80 mm modules and 110 mm modules. Specifically, system board 102 may include: mounting screw hole 182 and alignment hole 184 for 40 mm modules; mounting screw hole 186 and alignment hole 188 for 60 mm modules; mounting screw hole 190 and alignment hole 192 for 80 mm modules; and mounting screw hole 194 and alignment hole 196 for 110 mm modules.

Figure 5:
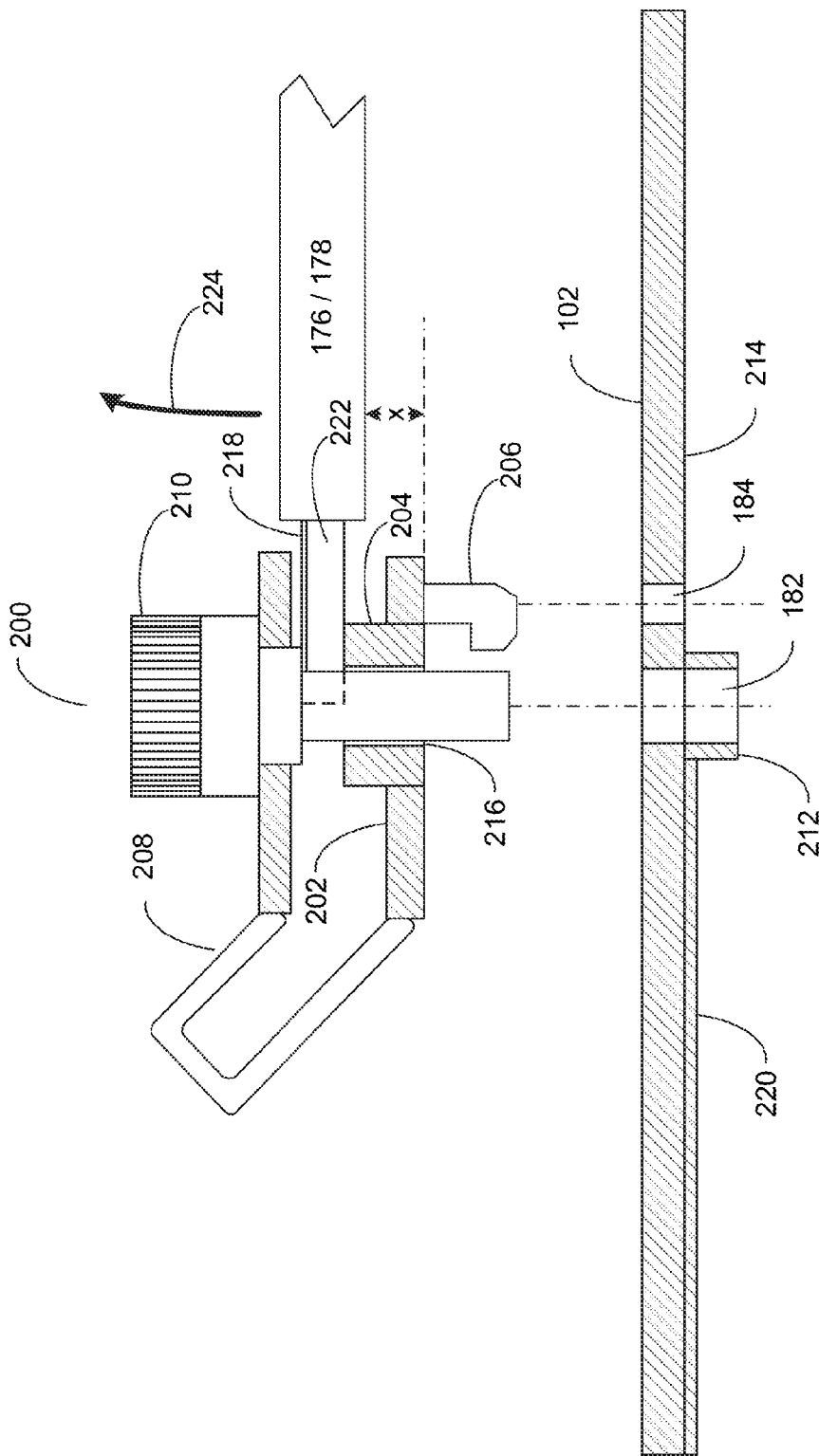
FIG. 5 is a memory module mounting system for use with the system board of FIG. 3.

Referring also to FIG. 5, there is shown memory module mounting system 200 to allow for the mounting of memory modules (e.g., memory modules 176, 178) onto system board 102. Memory module mounting system 200 may include bracket assembly 202 configured to engage system board 102. Bracket assembly 202 may include standoff assembly 204 that may be configured to position the memory module (e.g., memory modules 176, 178) a desired distance (e.g., "x") from system board 102. Bracket assembly 202 may be constructed of a non-conductive material, examples of which may include but are not limited to nylon and polyester.

Memory module mounting system 200 may include alignment pin assembly 206 configured to position bracket assembly 202 on system board 102. Alignment pin assembly 206 may be configured to releasably engage an alignment hole (e.g., alignment hole 184) within system board 102.

Memory module mounting system 200 may include tether assembly 208 flexibly coupled to bracket assembly 202. Tether assembly 208 may be constructed of a flexible, non-conductive material, examples of which may include but are not limited to nylon and polyester.

Memory module mounting system 200 may include screw assembly 210 held captive by tether assembly 208 and configured to pass though bracket assembly 202 and releasably engage system board 102. For example, a nut assembly (e.g., nut assembly 212) may be mounted onto lower surface 214 of system board 102, wherein screw assembly 210 may pass through passage 216 within bracket assembly 202 and mounting screw hole 182 within system board 102 and releasably engage nut assembly 212. An example of screw assembly 210 may include but is not limited to a toolless screw assembly (e.g., a knurled screw), thus allowing for the disengagement of screw assembly 210 from nut assembly 212 included within system board 102 without the need for tools.

Since tether assembly 208 is flexible, upon screw assembly 210 being unscrewed from nut assembly 212, screw assembly 210 may be swung out of the way, thus allowing for memory module 176/178 to be removed (in the direction of arrow 224). And since screw assembly 210 is held captive by tether assembly 208, the likelihood of screw assembly 210 being lost is reduced. Further, in the event that the current memory module is being replaced by a memory module having a different form factor (e.g., a 40 mm module is being replaced by a 80 mm module), memory module mounting system 200 may be remove from system board 102 and repositioned on system board 102 using a different set of mounting holes (e.g., moving memory module mounting system 200 from mounting screw hole 182/alignment hole 184 for 40 mm module) to mounting screw hole 190/alignment hole 192 for 80 mm modules).

Screw assembly 210 may be an electrically-conductive screw assembly that is configured to engage ground plane 218 of memory module 176/178 and ground plane 220 of system board 102. Specifically, screw assembly 210 may be configured to clamp tongue assembly 222 of memory module 176/178 between the lower surface of screw assembly 210 and standoff assembly 204, thus resulting in screw assembly 210 making electrical contact with ground plane 218 of memory module 176/178. Additionally, nut assembly 212 may be electrically coupled to ground plane 220 of system board 102. Accordingly and through the use of screw assembly 210, ground plane 218 of memory module 176/178 is electrically coupled to ground plane 220 of system board 102.

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A memory module mounting system comprising:
   a bracket assembly configured to engage a system board, the bracket assembly including:
      a standoff assembly that is configured to position a body portion of a memory module a desired distance from the system board, and
      an alignment pin assembly configured to position the bracket assembly on the system board;
   a tether assembly flexibly coupled to the bracket assembly;
   an electrically conductive screw assembly held captive by the tether assembly and configured to pass though the bracket assembly and releasably engage the system board and configured to clamp a ground plane of a tongue assembly of the memory module between the screw assembly and the standoff assembly, wherein the thickness of the tongue assembly of the memory module is less than the thickness of the body portion of the memory module;
   wherein the system board includes a connector configured to receive the memory module and a plurality of mounting points configured to receive one or more of the screw assembly and the alignment pin assembly, wherein the position of the plurality of mounting points on the system board is associated with a plurality of pre-defined memory module lengths.

2. The memory module mounting system of claim 1 wherein the screw assembly is configured to engage a ground plane of the system board.

3. The memory module mounting system of claim 1 wherein the screw assembly is a toolless screw assembly.

4. The memory module mounting system of claim 1 wherein the screw assembly is configured to releasably engage a nut assembly coupled to the system board.

5. The memory module mounting system of claim 1 wherein the tether assembly is constructed of a flexible, non-conductive material.

6. The memory module mounting system of claim 1 wherein the bracket assembly is constructed of a non-conductive material.

7. The memory module mounting system of claim 1 wherein the alignment pin assembly is configured to releasably engage an alignment hole within the system board.

8. The memory module mounting system of claim 1 wherein the memory module is a non-volatile memory module.

9. The memory module mounting system of claim 1 wherein the memory module is an M.2 memory module.

10. A memory module mounting system comprising:
    a bracket assembly configured to engage a system board, the bracket assembly including:
       a standoff assembly that is configured to position a body portion of a memory module a desired distance from the system board, and
       an alignment pin assembly configured to position the bracket assembly on the system board;
    a tether assembly flexibly coupled to the bracket assembly, wherein the tether assembly is constructed of a flexible, non-conductive material;
    an electrically-conductive screw assembly held captive by the tether assembly and configured to pass though the bracket assembly and releasably engage the system board and configured to clamp a ground plane of a tongue assembly of the memory module between the screw assembly and the standoff assembly, wherein the thickness of the tongue assembly of the memory module is less than the thickness of the body portion of the memory module;
    wherein the system board includes a connector configured to receive the memory module and a plurality of mounting points configured to receive one or more of the screw assembly and the alignment pin assembly, wherein the position of the plurality of mounting points on the system board is associated with a plurality of pre-defined memory module lengths.

11. The memory module mounting system of claim 10 wherein the screw assembly is configured to engage a ground plane of the system board.

12. The memory module mounting system of claim 10 wherein the screw assembly is configured to releasably engage a nut assembly coupled to the system board.

13. The memory module mounting system of claim 10 wherein the alignment pin assembly is configured to releasably engage an alignment hole within the system board.

14. The memory module mounting system of claim 10 wherein the bracket assembly is constructed of a non-conductive material.

15. A memory module mounting system comprising:
    a bracket assembly configured to engage a system board, the bracket assembly including:
       a standoff assembly that is configured to position a body portion of an M.2 memory module a desired distance from the system board, and
       an alignment pin assembly configured to position the bracket assembly on the system board;
    a tether assembly flexibly coupled to the bracket assembly;
    an electrically-conductive screw assembly held captive by the tether assembly and configured to pass though the bracket assembly and releasably engage the system board, wherein the screw assembly is configured to engage a ground plane of a tongue assembly of the M.2 memory module and a ground plane of the system board and wherein the thickness of the tongue assembly of the memory module is less than the thickness of the body portion of the memory module;

wherein the system board includes a connector configured to receive the memory module and a plurality of mounting points configured to receive one or more of the screw assembly and the alignment pin assembly, wherein the position of the plurality of mounting points on the system board is associated with a plurality of pre-defined memory module lengths.

16. The memory module mounting system of claim 15 wherein the screw assembly is a toolless screw assembly.

17. The memory module mounting system of claim 15 wherein the alignment pin assembly is configured to releasably engage an alignment hole within the system board.

* * * * *